(12) United States Patent
Kasahara et al.

(10) Patent No.: US 7,592,611 B2
(45) Date of Patent: Sep. 22, 2009

(54) CREATION METHOD AND CONVERSION METHOD OF CHARGED PARTICLE BEAM WRITING DATA, AND WRITING METHOD OF CHARGED PARTICLE BEAM

(75) Inventors: Jun Kasahara, Kanagawa (JP); Shigehiro Hara, Kanagawa (JP); Hitoshi Higurashi, Kanagawa (JP); Akihito Anpo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 402 days.

(21) Appl. No.: 11/470,113

(22) Filed: Sep. 5, 2006

(65) Prior Publication Data

US 2007/0053242 A1     Mar. 8, 2007

(30) Foreign Application Priority Data

Sep. 7, 2005   (JP)   ............................. 2005-258734

(51) Int. Cl.
*G11B 11/00* (2006.01)
(52) U.S. Cl. .............................. 250/492.22; 250/492.2; 250/492.1; 716/19; 369/13.01; 700/121
(58) Field of Classification Search ............ 250/492.22, 250/492.1, 492.2; 702/82, 801, 81; 714/701; 716/19; 369/13.01; 700/121
See application file for complete search history.

(56) References Cited

U.S. PATENT DOCUMENTS 5,995,878 A * 11/1999 Miyajima ................... 700/121
6,060,717 A *  5/2000 Manabe et al. ......... 250/492.22
6,064,807 A *  5/2000 Arai et al. ..................... 430/30
6,275,604 B1 * 8/2001 Miyajima et al. ........... 382/146

(Continued)

FOREIGN PATENT DOCUMENTS

JP         57-122529         7/1982

(Continued)

OTHER PUBLICATIONS

Shunko Magoshi, et al., "High-Speed Electron Beam Data Conversion System Combining Hierarchical Operation with Parallel Processing", Jpn. J. Appl. Phys., vol. 31, part 1, No. 12B, Dec. 1992, pp. 4257-4261.

*Primary Examiner*—David A Vanore
*Assistant Examiner*—Michael J Logie
(74) *Attorney, Agent, or Firm*—Oblon, Spivak, McClelland, Maier & Neustadt, L.L.P.

(57) ABSTRACT

A creation method of charged particle beam writing data for writing a pattern using a charged particle beam based on design data of circuits includes creating, based on the design data, a location data file including location data, as part of the writing data, the location data being defined for locating one of a plurality of pattern data composed of one or more elementary patterns in each block area of a plurality of block areas, the plurality of block areas being made by virtually dividing a writing area, creating, based on the design data, a pattern data file including pattern data composed of one or more elementary patterns, as part of the writing data, and creating, based on the design data, a link file including link data for linking each of the location data and each of the pattern data, as part of the writing data.

12 Claims, 19 Drawing Sheets

U.S. PATENT DOCUMENTS

| | | | |
|---|---|---|---|
| 6,313,476 B1 * | 11/2001 | Shimizu et al. | 250/492.22 |
| 6,415,432 B1 * | 7/2002 | Saito et al. | 716/21 |
| 6,566,662 B1 * | 5/2003 | Murakami et al. | 250/492.1 |
| 7,194,328 B1 * | 3/2007 | Haskins et al. | 700/174 |
| 2002/0081501 A1 * | 6/2002 | Hasegawa et al. | 430/5 |
| 2004/0060033 A1 * | 3/2004 | Kamon | 716/19 |
| 2006/0164115 A1 * | 7/2006 | Komiya et al. | 324/765 |

FOREIGN PATENT DOCUMENTS

JP     5-29202     2/1993

* cited by examiner

| Cell Location Data File |
|---|
| File Header |
| : |
| Block (0,0)　Header |
| Cell Location L1 |
| Cell Location L2 |
| Block (0,1)　Header |
| Cell Location L3 |
| Cell Location L4 |
| Block (1,0)　Header |
| Cell Location L5 |
| Cell Location L6 |
| Block (1,1)　Header |
| Cell Location L7 |

| Link File |
|---|
| File Header |
| : |
| Link Data k1 |
| Link Data k2 |
| Link Data k3 |
| Link Data k4 |
| Link Data k5 |
| Link Data k6 |
| : |

| Cell Pattern Data File |
|---|
| File Header |
| : |
| Pattern Data Segment (I) Header |
| Cell Pattern DataA |
| Cell Pattern DataC |
| Pattern Data Segment (II) Header |
| Cell Pattern DataC |
| Cell Pattern DataA |
| Pattern Data Segment (III) Header |
| Cell Pattern DataB |
| Pattern Data Segment (IV) Header |
| Cell Pattern DataC |

FIG. 11A　　　FIG. 11B　　　FIG. 11C

Correspondence Table

| Cell Pattern Data Type | Times | |
|---|---|---|
| Cell Pattern Data A | 2 | Reference |
| Cell Pattern Data B | 1 | Value |
| Cell Pattern Data C | 3 | Reference |
| Cell Pattern Data D | 1 | Value |
| Cell Pattern Data E | 1 | Value |

FIG. 17

CREATION METHOD AND CONVERSION METHOD OF CHARGED PARTICLE BEAM WRITING DATA, AND WRITING METHOD OF CHARGED PARTICLE BEAM

CROSS-REFERENCE TO RELATED APPLICATION

The present application is based upon and claims the benefit of priority from the prior Japanese Patent Application No. 2005-258734 filed on Sep. 7, 2005 in Japan, the entire contents of which are incorporated herein by reference.

BACKGROUND OF THE INVENTION

1. Field of the Invention

The present invention relates to a creation method of charged particle beam data, a conversion method of charged particle beam data, and a writing method of a charged particle beam, and more particularly, to a creation method of writing data used in an electron beam pattern writing apparatus and a conversion method of writing data processed in the electron beam pattern writing apparatus.

2. Description of Related Art

Microlithography technology which forwards miniaturization of semiconductor devices is extremely important, because only this process performs forming a pattern in semiconductor manufacturing processes. In recent years, circuit line widths used when writing a desired pattern on semiconductor devices are becoming minute year after year with an increase in high-integration of LSI. In order to form a desired circuit pattern on these semiconductor devices, a high-precision original pattern, such as a reticle or a photomask, is needed. The electron beam writing technology for writing or "drawing" a pattern herein essentially has excellent resolution, and therefore is used for manufacturing such high-precision original patterns.

FIG. 20 shows a conceptual diagram for explaining operations of a variable-shaped electron beam pattern writing apparatus. As shown in the figure, the variable-shaped electron beam pattern writing apparatus (EB (Electron beam) writing apparatus) includes two aperture plates. A first or "upper" aperture plate 410 has an opening or "hole" 411 in the shape of rectangle, for shaping an electron beam 442. This shape of the rectangular opening may also be a square, a rhombus, a rhomboid, etc. A second or "lower" aperture plate 420 has a variable shaping opening 421 for shaping the electron beam 442 having passed through the opening 411 of the first aperture plate 410 into a desired cross-section. The electron beam 442 that left a charge particle source 430 and has passed through the opening 411 of the first aperture plate 410 is deflected by a deflector to pass through part of the variable shaping opening 421 of the second aperture plate 420, and reaches a target object mounted on a stage which is continuously moving in one predetermined direction (e.g. X-axis direction). In other words, a rectangular shape capable of passing through both the opening 411 and the variable shaping opening 421 is written or "drawn" in a pattern writing area of a target object 440 mounted on the stage continuously moving in the X-axis direction. This method of writing or "forming" an arbitrary shape by letting beams pass through both the opening 411 and the variable shaping opening 421 is called the "variable shaping."

To start performing such electron beam pattern writing, a layout of a semiconductor integrated circuit is designed first, and layout data (design data) for writing the design is created. Then, the layout data is converted into writing data to be input into an electron beam pattern writing apparatus. Further, the writing data is converted into internal data in EB writing apparatus to write a pattern.

With an increase in high-integration of LSI, it is requested to compress data amount because the amount of data processed by the EB writing apparatus is enormously increasing. Conventionally, when converting design data into writing data, the conversion is performed one by one for all the figures needed to be converted into writing data. For example, if two or more identical figures exist in one block, converting is performed for each of the figures. This method, however, has a problem that the processing time necessary for creating the writing data becomes enormous. Moreover, there is another problem that extremely large processing time is needed to transmit the created writing data to an electron beam pattern writing apparatus.

With the aim of reducing data amount, a method for creating writing data where data groups, each of which is composed of basic pattern data and location data for locating the basic pattern data, are continuously strung in one data file is disclosed, for example, in JP-A-05-29202.

It is possible to reduce data amount by creating data composed of data groups of basic pattern data and a plurality of pieces of location data defined one or more times for one basic pattern data as described in JP-A-05-29202. However, such data structure has little flexibility and it would require much time to reconfigure location data if it is needed because of intermingling of location data and pattern data.

BRIEF SUMMARY OF THE INVENTION

It is an object of the present invention to solve the problem mentioned above, and to provide a method of creating writing data that is highly efficiently processable and a method of converting writing data very efficiently.

In accordance with one aspect of the present invention, a creation method of charged particle beam writing data for writing a pattern using a charged particle beam based on design data of circuits includes creating, based on the design data, a location data file including location data, as part of the writing data, the location data being defined for locating one of a plurality of pattern data composed of one or more elementary patterns in each block area of a plurality of block areas, the plurality of block areas being made by virtually dividing a writing area, creating, based on the design data, a pattern data file including pattern data composed of one or more elementary patterns, as part of the writing data, and creating, based on the design data, a link file including link data for linking each of the location data and each of the pattern data, as part of the writing data.

In accordance with another aspect of the present invention, a creation method of writing data for writing a pattern using a charged particle beam based on design data of circuits includes creating, based on the design data, a first data group collecting location data for locating one of a plurality of pattern data composed of one or more elementary patterns in each of a plurality of block areas, as part of the writing data, the plurality of block areas being made by virtually dividing a writing area, creating, based on the design data, a second data group collecting each of pattern data of the plurality of pattern data composed of one or more elementary patterns, as part of the writing data, creating, based on the design data, a third data group collecting link data for linking the location data and the pattern data, as part of the writing data, and creating a data file in which the first data group, the second data group, and the third data group are combined.

In accordance with another aspect of the present invention, a conversion method of charged particle beam writing data includes inputting charged particle beam writing data including a pattern data file in which each of pattern data composed of one or more elementary patterns is stored once, and re-creating, based on the each of the pattern data included in the pattern data file mentioned above, the pattern data file to respectively store each of the pattern data composed of one or more elementary patterns in a pattern data segment corresponding to each of block areas where the pattern data is located, the block areas being made by virtually dividing a writing area.

In accordance with another aspect of the present invention, a conversion method of charged particle beam writing data includes inputting writing data for writing using a charged particle beam, converting only pattern data to be used a plurality of times in a writing area, in a plurality of pattern data contained in the writing data, into a writing apparatus internal format to be used in a writing apparatus, storing converted data of the writing apparatus internal format in a storage device temporarily, and in each block area, when a pattern data that has already been converted into the writing apparatus internal format is detected, reading the converted data from the storage device, and converting other pattern data into the writing apparatus internal format.

In accordance with another aspect of the present invention, a writing method of charged particle beam includes inputting writing data including a first data group collecting location data for locating one of a plurality of pattern data composed of one or more elementary patterns, a second data group collecting pattern data composed of one or more elementary patterns, and a third data group collecting link data for linking each location data and each pattern data, converting the writing data into a writing apparatus internal format to be used in a writing apparatus, based on the first, the second, and the third data groups, and writing an intended pattern onto a target object, based on the data of the writing apparatus internal format.

BRIEF DESCRIPTION OF THE DRAWINGS

FIGS. 11A, 11B and 11C show a relation between a cell location data file and a cell pattern data file after localization processing;

FIG. 17 shows an example of a correspondence table;

DETAILED DESCRIPTION OF THE INVENTION

In the following Embodiments, a structure utilizing an electron beam as an example of a charged particle beam will be described. The charged particle beam is not restricted to the electron beam, and may be the one using a charged particle, such as an ion beam.

Embodiment 1

The present Embodiment is based upon that time for conversion processing can be reduced and amount of writing data can be compressed by performing data conversion utilizing a hierarchical structure of design data and by outputting it as writing data of a hierarchical format. Regarding processes performed in a writing apparatus after writing data being input, some processing is applied for the writing data to make it have an almost flat data structure finally. Upon performing processes, it is desirable to execute hierarchical expansion in the latter part as late as possible in order to lessen processing efficiency reduction associated with the expansion. Accordingly, in the present Embodiment, a data processing method of performing highly efficient parallel processing, with having a hierarchical structure, will be described.

Figure 1:
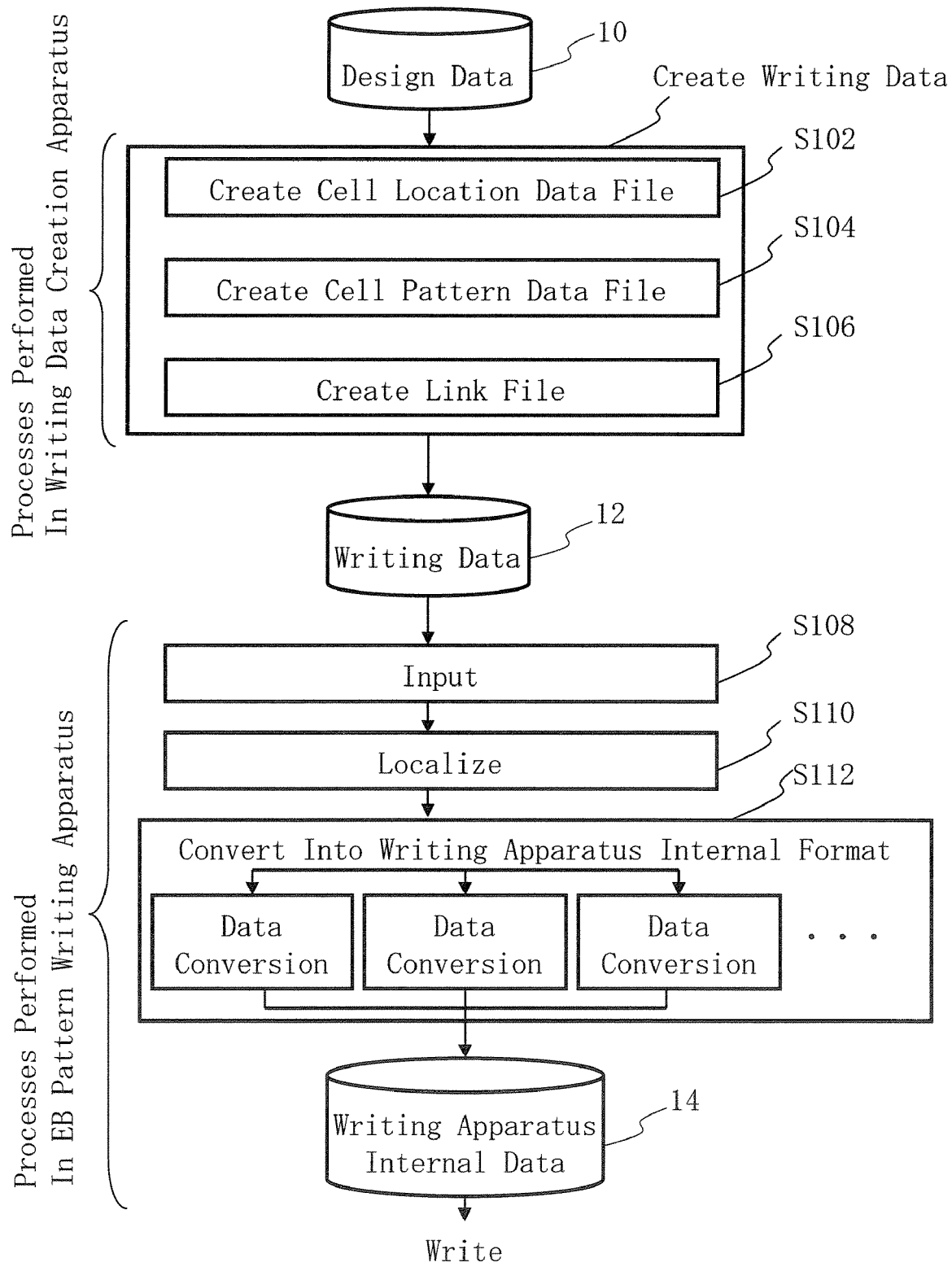
FIG. 1 is a flowchart showing main processes of a creation method of electron beam writing data and a conversion method of the electron beam writing data according to Embodiment 1.

FIG. 1 is a flowchart showing main processes of a creation method of electron beam writing data and a conversion method of the electron beam writing data according to Embodiment 1. As shown in the figure, design data 10 is converted into writing data 12 in a writing data creation apparatus. The created writing data 12 is input into an electron beam pattern writing apparatus and converted into writing apparatus internal data 14. In FIG. 1, the creation method of electron beam writing data executes a series of processes of a cell location data file creation process (S102) as an example of a location data file creation process, a cell pattern data file creation process (S104) as an example of a pattern data file creation process, and a link file creation process (S106). The conversion method of electron beam writing data executes a series of processes of an input process (S108), a localization process (S110), and a writing apparatus internal format conversion process (S112).

Figure 2:
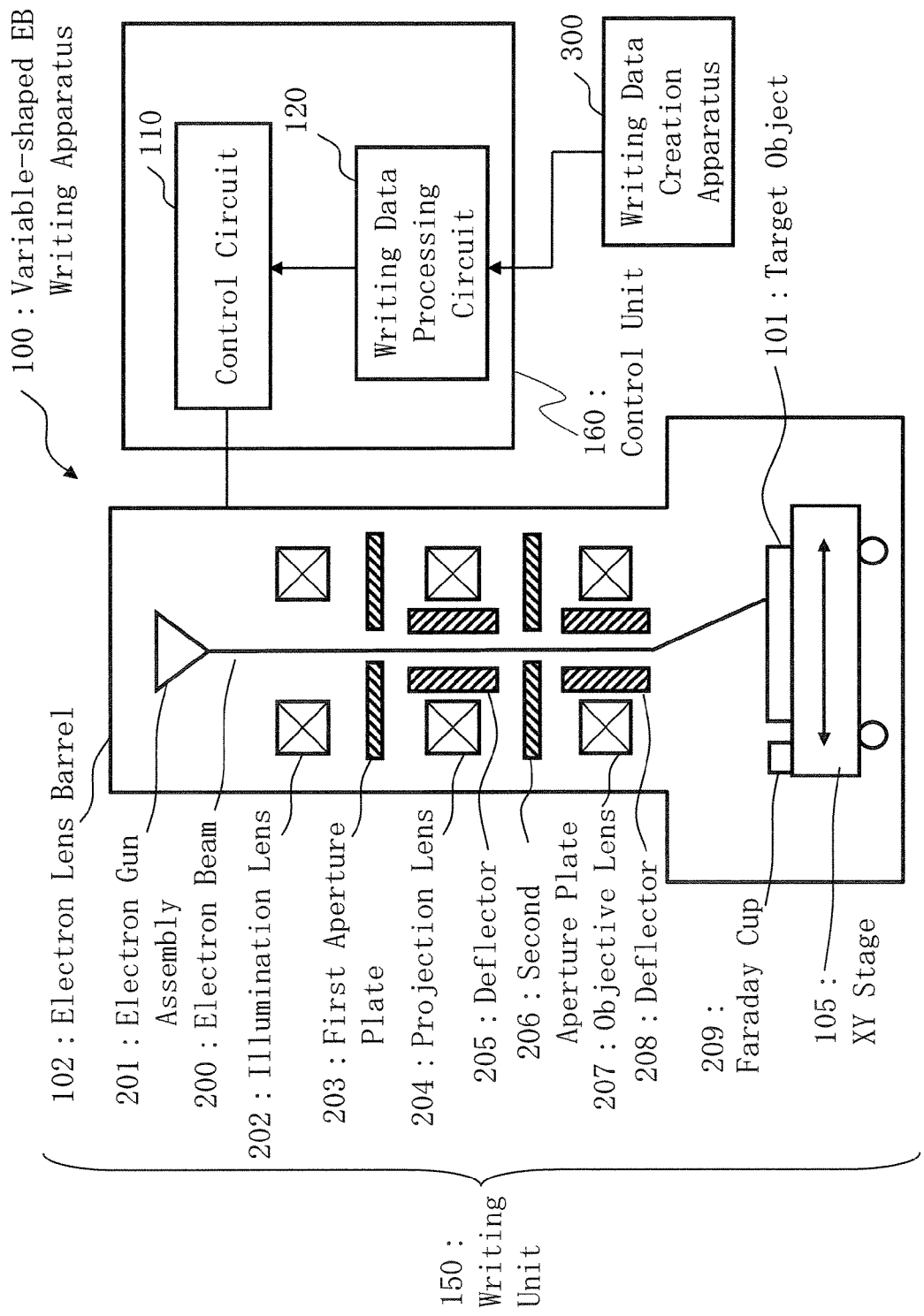
FIG. 2 shows a main structure of a writing apparatus.

FIG. 2 shows a main structure of a writing apparatus. As shown, a variable-shaped EB writing apparatus 100 being an example of a writing apparatus includes a writing unit 150 and a control unit 160. The control unit 160 includes a control circuit 110 and a writing data processing circuit 120. The writing unit 150 includes an electron lens barrel 102, an XY stage 105, an electron gun assembly 201, an illumination lens 202, a first or "upper" aperture plate 203, a projection lens 204, a deflector 205, a second or "lower" aperture plate 206, an objective lens 207, a deflector 208, and a Faraday cup 209. Components required for explaining Embodiment 1 are illustrated in FIG. 2, and it should be understood that other components usually needed for the variable-shaped EB writing apparatus 100 are also included.

In a writing data creation apparatus 300, the writing data 12 is created and output to the writing data processing circuit 120. The writing data processing circuit 120 converts the inputted writing data 12 into the internal data 14 for the writing apparatus 100, the writing unit 150 is controlled by the control circuit 110 based on the writing apparatus internal data 14, and thereby a desired figure pattern is written on a target object.

An electron beam 200 leaving the electron gun assembly 201 irradiates, by the illumination lens 202, the whole of a rectangular opening which is formed in the first aperture plate 203. At this point, the electron beam 200 is shaped to have a square cross-section. Then, after having passed through the first aperture plate 203, the electron beam 200 of a first aperture image is guided by the projection lens 204 to reach the second aperture plate 206. The position of the first aperture image on the second aperture plate 206 is controlled by the deflector 205 to change the shape and size of the beam. After having passed through the second aperture plate 206, the electron beam 200 of a second aperture image is focus-adjusted by the objective lens 207 and then deflected by the deflector 208 to reach a desired position on a target object 101, which is movably placed, on the XY stage 105. As to beam intensity etc., it can be measured by irradiating the electron beam 200 onto the Faraday cup 209.

Figure 3:
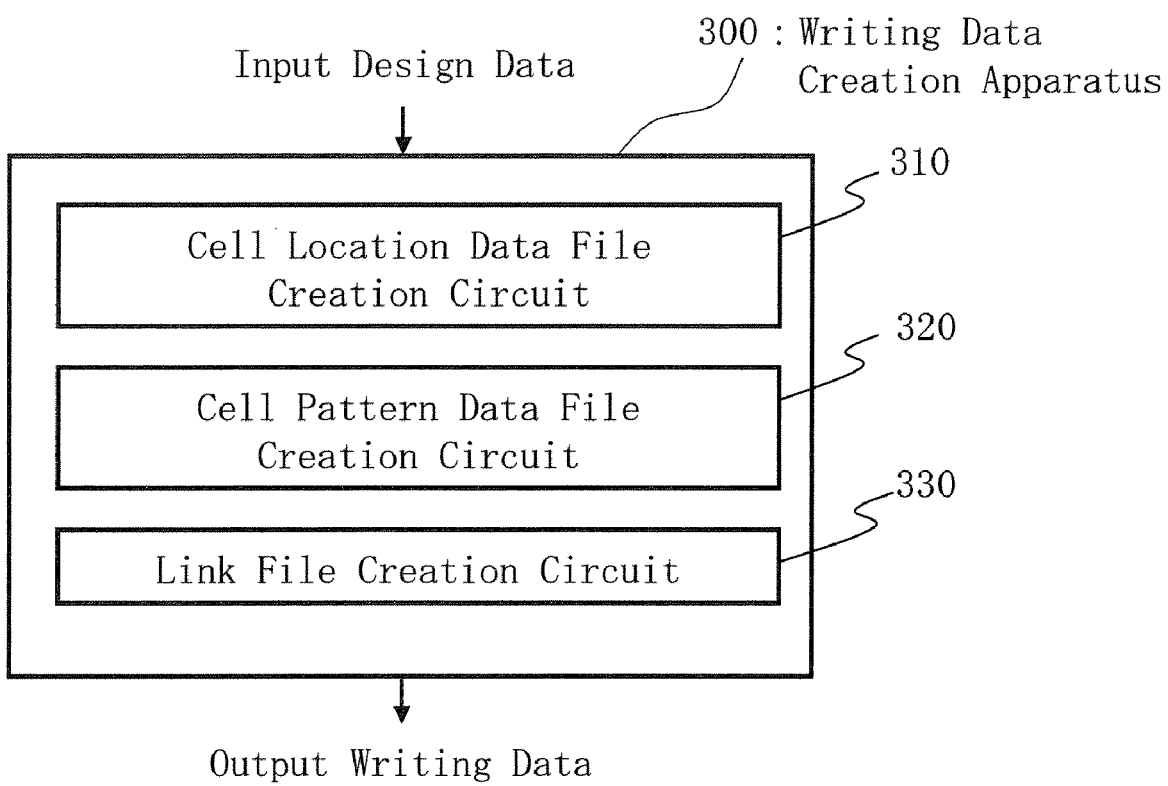
FIG. 3 is a block diagram showing a main configuration of a writing data creation apparatus.

FIG. 3 is a block diagram showing a main configuration of the writing data creation apparatus. As shown in the figure, the writing data creation apparatus 300 includes a cell location data file creation circuit 310, a cell pattern data file creation circuit 320, and a link file creation circuit 330. Configuration elements required for explaining Embodiment 1 are illustrated in FIG. 3, and it should be understood that other configuration elements usually needed for the writing data creation apparatus 300 are also included. For example, an illustration of an input and/or output means etc. is omitted.

Figure 4:
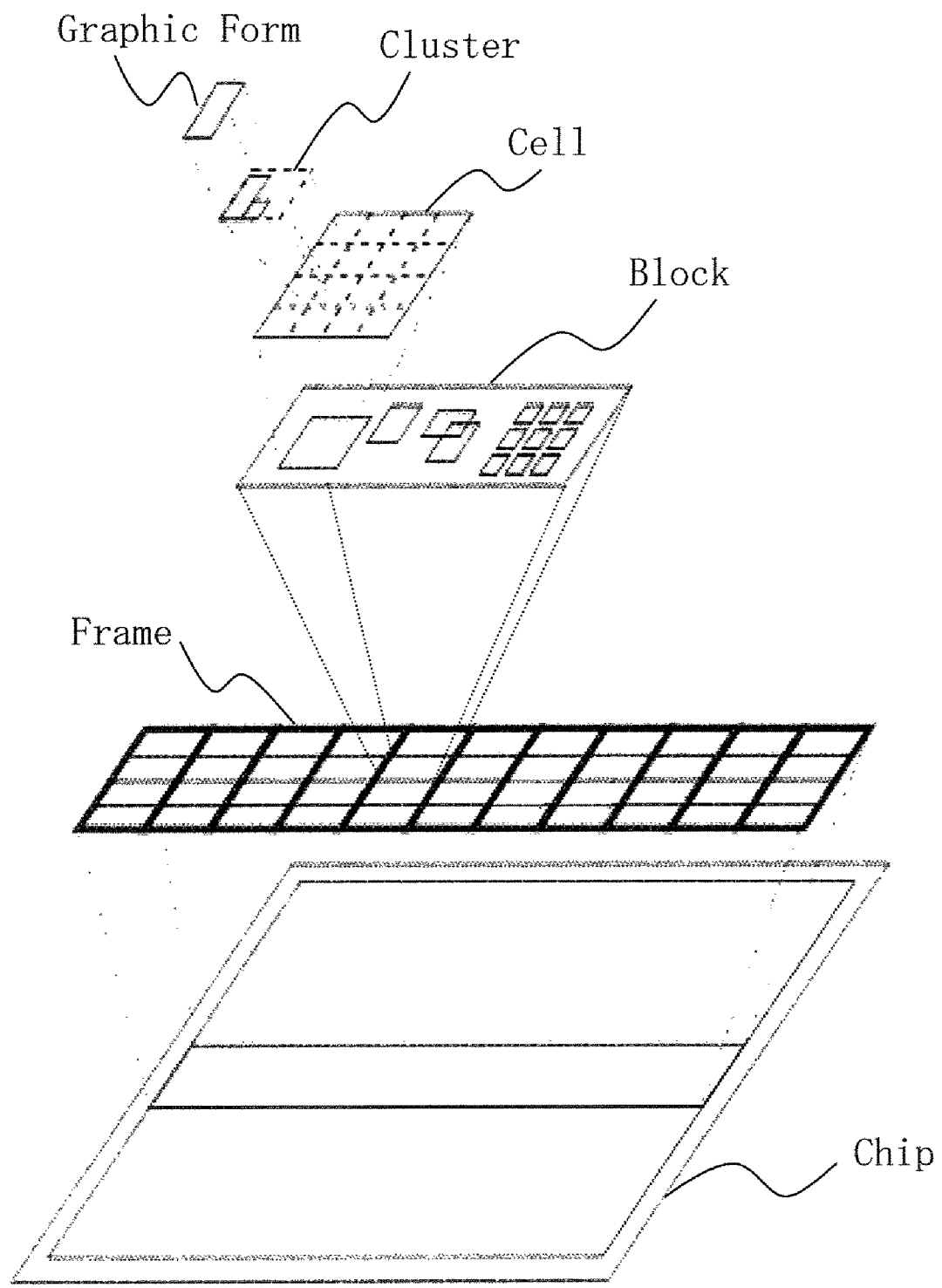
FIG. 4 shows an example of a data hierarchical structure.

FIG. 4 shows an example of a data hierarchical structure. In the design data 10, a plurality of cells are located on a chip and further a figure to be a pattern for configuring each cell is located on each of the cells. In the writing data 12, as shown in FIG. 4, a pattern writing area, or "writing region" has a hierarchical structure composed of a series of plural internal configuration units, such as a layer of a chip, a layer of a frame, a layer of a block, a layer of the cell stated above, and a layer of a figure to be a pattern for configuring the cell. The layer of a frame is formed by dividing a chip area, or "chip region" into a plurality of strip-like portions parallel to a drawing surface and arrayed in a certain direction, for example, Y-axis direction. The layer of a block is formed by dividing a frame area, or "frame region" into areas of a predetermined size. Regarding the writing apparatus internal data 14, it further has a layer of a cluster as an internal configuration unit. FIG. 4 depicts the data hierarchical structure of the writing apparatus internal data 14 having many hierarchical layers, as an example. In addition, although the frame mentioned above is herein formed by dividing the chip area into a plurality of strip-like portions arrayed in the Y-axis direction (predetermined direction) as an example, there is possibility of dividing it into portions parallel to the drawing surface and arrayed in the direction of X-axis being orthogonal to the Y-axis.

In manufacturing a semiconductor integrated circuit, it begins with designing a layout of a semiconductor integrated circuit to create the design data 10. Then, the design data 10 is converted by the writing data creation apparatus 300 into the writing data 12 used in the EB writing apparatus 100 being an example of an electron beam pattern writing apparatus. Upon being input into the EB writing apparatus 100, the writing data 12 is converted into a writing apparatus internal format to create the writing apparatus internal data 14, in the writing data processing circuit 120. Thus, the writing apparatus starts to write a figure pattern included in the data onto a target object, such as a mask, by using an electron beam.

Figure 5:
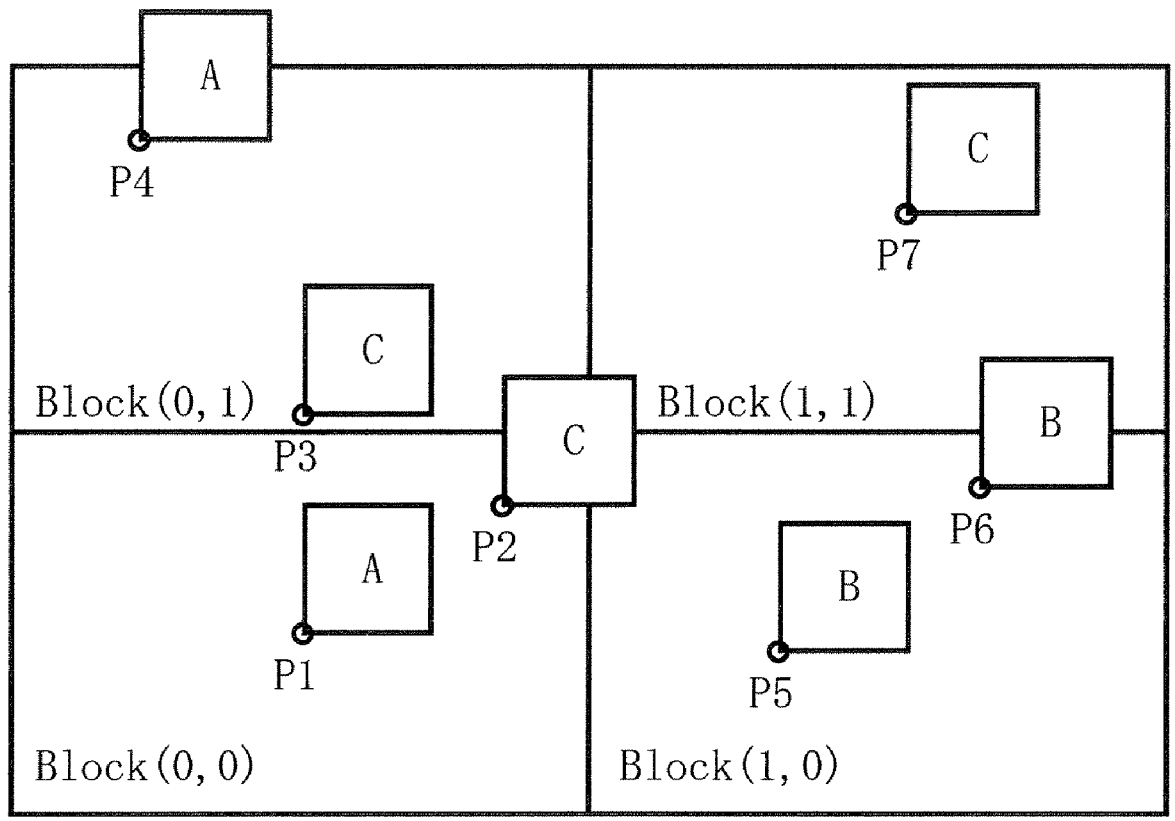
FIG. 5 shows an example of cell location.

FIG. 5 shows an example of cell location. For example, it is assumed that cells A, cells B, and cells C are located in each block in part of a certain frame as shown in FIG. 5. Concretely, the position of each block is plotted in coordinates. In the block (0, 0), a cell A is located at coordinate point P1 and a cell C is located at coordinate point P2. In the block (0, 1), a cell C is located at coordinate point P3 and a cell A is located at coordinate P4. In the block (1, 0), a cell B is located at coordinate point P5 and another cell B is located at coordinate point P6. In the block (1, 1), a cell C is located at coordinate point P7. Depending upon a position of the reference point of a cell, it may be decided which cell is located in which block.

At the step S102 of FIG. 1, as a cell location data file creation process, when the design data 10 is input into the writing data creation apparatus 300, the cell location data file creation circuit 310 creates a cell location data file based on the design data 10.

Figures 6A, 6B, 6C:
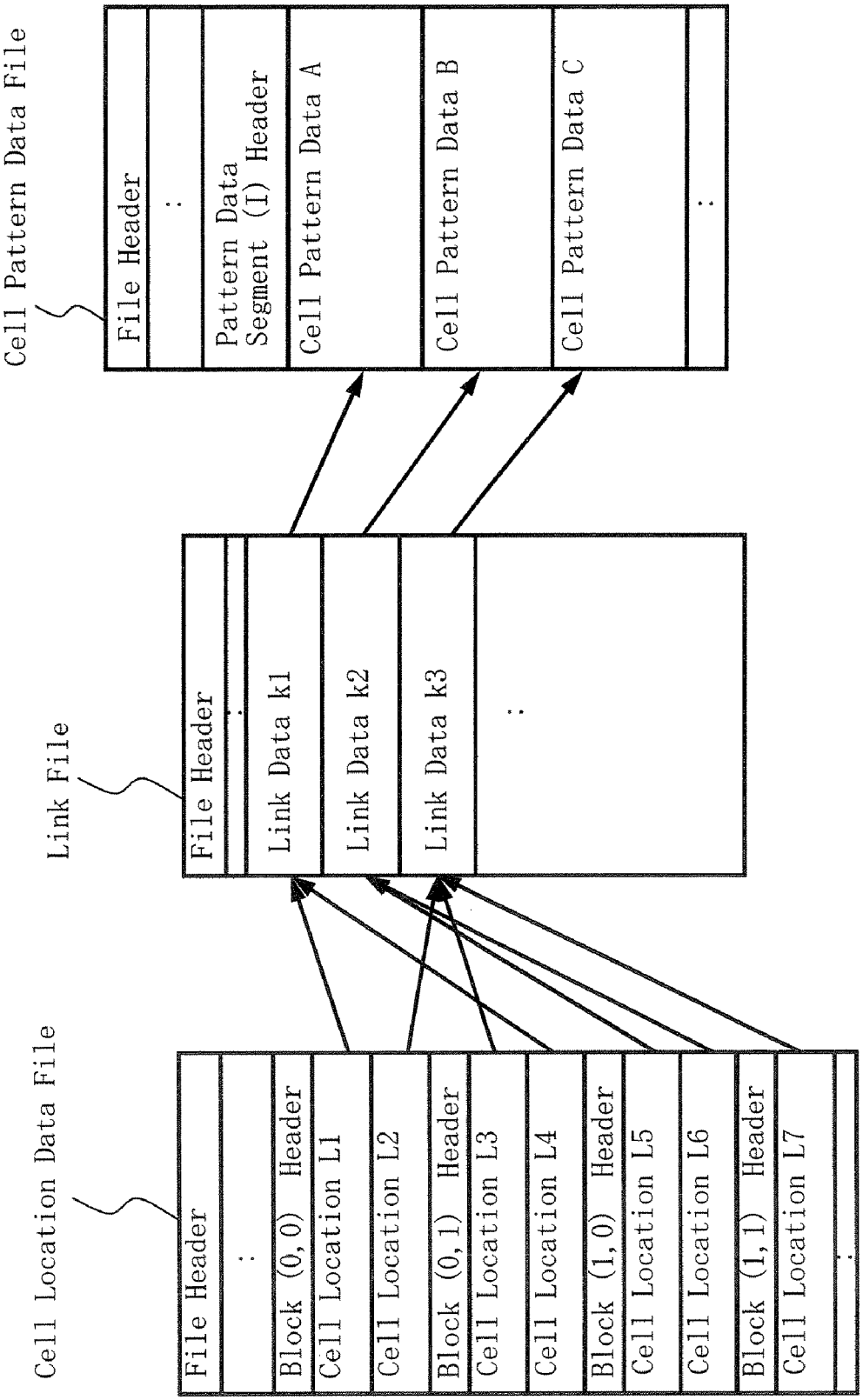
FIGS. 6A, 6B, and 6C show examples of a cell location data file, a link file, and a cell pattern data file upon illustrating corresponding relation among them.

FIGS. 6A, 6B, and 6C show examples of the cell location data file, the link file, and the cell pattern data file upon illustrating corresponding relation among them. The cells A, B, and C are composed of one or more elementary patterns. As shown in FIG. 6A, in the cell location data file, location data for locating one of the cells A, B, and C in each block area, or "block region" is included. The each block area is one of a plurality of block areas made by virtually dividing a writing area as stated above. The cell location data is plotted in coordinates denoting a locational position of the reference point of the cell. In FIG. 6A, following the file header of the cell location data file, the header of the block (0, 0), cell location data L1 and cell location data L2 being information on locational positions of the cells located in the block (0, 0), the header of the block (0, 1), cell location data L3 and cell location data L4 being information on locational positions of the cells located in the block (0, 1), the header of the block (1, 0), cell location data L5 and cell location data L6 being information on locational positions of the cells located in the block (1, 0), the header of the block (1, 1), and cell location data L7 being information on locational position of the cell located in the block (1, 1) are stored in the cell location data file.

Figure 7:
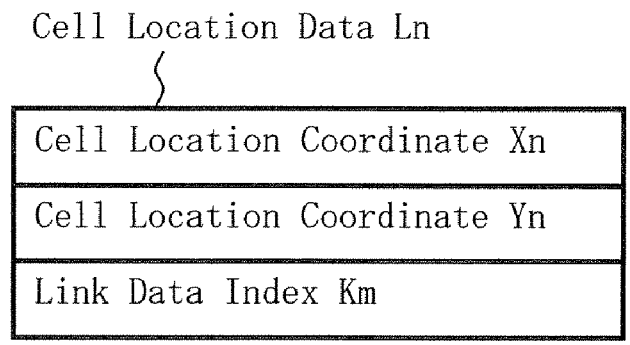
FIG. 7 shows an example of cell location data.

FIG. 7 shows an example of cell location data. Cell location data Ln includes cell location coordinates Pn (Xn, Yn) and link data index (Km). Referring to such data in the cell location data file, it is possible to grasp coordinates indicating positions of cells located in each block and information required for making a link to cell pattern data (described later).

At the step S104 of FIG. 1, as a cell pattern data file creation process, when the design data 10 is input into the writing data creation apparatus 300, the cell pattern data file creation circuit 320 creates a cell pattern data file based on the design data 10.

As shown in FIG. 6C, the cell pattern data file includes pattern data of each of the cells A, B, and C, being composed of one or more elementary patterns mentioned above. In this case, following the file header of the cell pattern data file, the header of pattern data segment (I), cell pattern data A indicating pattern data of the cell A, cell pattern data B indicating pattern data of the cell B, and cell pattern data C indicating pattern data of the cell C are orderly stored once. That is, one type of data, meaning each of the pattern data A on the cell A, the pattern data B on the cell B, and the pattern data C on the cell C, is stored only once in one segment. In other words, even when a certain type of pattern data is needed to use twice or more in a segment, storing times of the pattern data in the segment is only once. The cell pattern data includes figure data, etc. being large amount for configuring a cell pattern.

In the case of the cells being located in the layout as shown in FIG. 5, the cell pattern data A is needed for the cell location data L1 and L4, the cell pattern data B is needed for the cell location data L5 and L6, and the cell pattern data C is needed for the cell location data L2, L3 and L7. If such cell pattern data is stored several times repeatedly for each location, the amount of the data will become huge. Then, by only once storing each type of cell pattern data in order in one segment as shown in FIG. 6C, it is possible to compress the data amount.

At the step S106 of FIG. 1, as a file creation process, when the design data 10 is input into the writing data creation apparatus 300, the link file creation circuit 330 creates a link file based on the design data 10.

Figure 8:
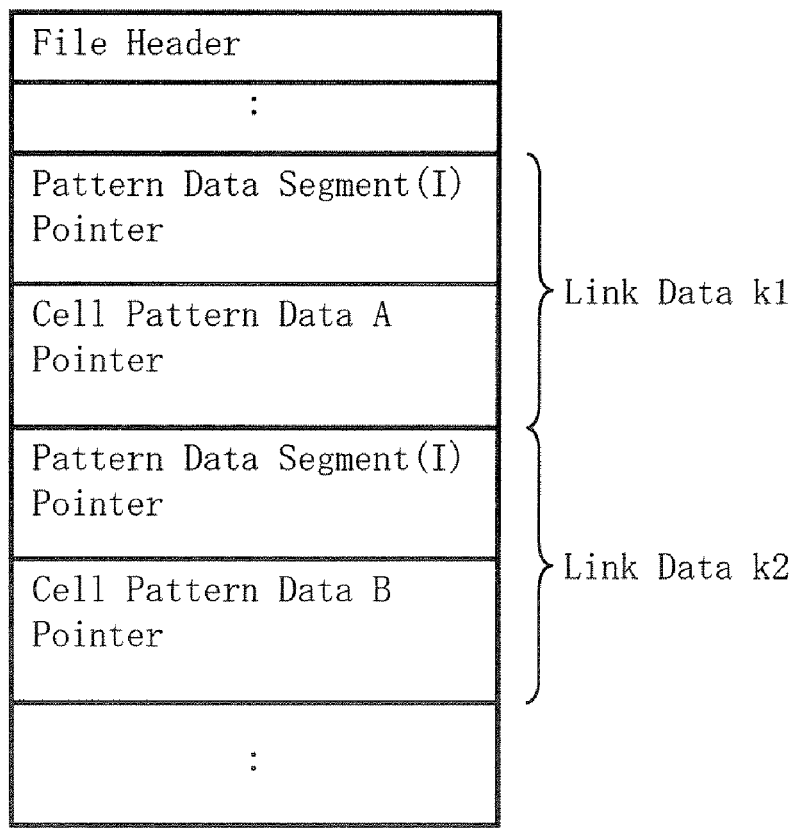
FIG. 8 shows an example of a link file.

FIG. 8 shows an example of a link file. As shown in the figure, the link file includes link data to link the cell location data and the cell pattern data. In the link file in this case, following the file header of the link file, a plurality of groups of link data are stored, each of which is corresponding to each cell pattern data and is composed of a head address of a pattern data segment in the cell pattern data file and a head address of cell pattern data in the pattern data segment.

For example, as shown in FIG. 6B, the cell A is referred to from the cell location data L1 through the link data k1. An index value indicating an order number of a position of a group is stored in cell location data Ln (n=1, in this case) as a link data index Km (m=1, in this case) as shown in FIG. 7, wherein the group is composed of the address of a pattern data segment to which the cell pattern data A belongs, and the address of the cell pattern data A. Since there is only one pattern data segment in the pattern data file in the case of FIG. 6C, the same pattern data segment address is stored in all link data, resulting in such address becoming rather long. However, in order to store localized data (localization to be processed later) by using the same format, a structure in which a pattern data segment address is stored in each link data is required.

In the writing data creation apparatus 300, as mentioned above, a data amount can be compressed by creating a cell location data file, a cell pattern data file, and a link file as part of the writing data 12. Then, compressing the data amount enables access time to necessary data to be reduced. Consequently, it is possible to create the writing data 12 whose necessary data can be read effectively.

As mentioned above, by storing location data and pattern data in discrete files as electron beam writing data, it becomes unnecessary to create writing data in which pattern data is located for each locational position point by point. Consequently, the amount of pattern data, accounting for the hugest data amount, can be reduced, which realizes to decrease the whole data amount.

In addition, although the method of outputting cell location data (the first data group), cell pattern data (the second data group), and link data (third data group) respectively as separate files has been herein explained, the file creation method is not restricted to this. It is also possible to output one file in which these three are connected, for example. Moreover, creating each data file for each frame or other method is also acceptable. For example, the method of creating a cell location data file and a link file for each frame, and creating a cell pattern data file using one chip, namely one chip for one file, may also be acceptable. In the case of the same pattern being used in different frames, since the cell pattern data is shared among all the frames, the data amount can be further effectively compressed.

Generally, when performing a proximity effect correction etc. in a writing apparatus, chip merge processing meaning that a plurality of chips are collected to be one and cells are distributed to specific areas is executed, taking the influence from adjacent chips into consideration. In performing reconfiguration processing of location data, such as the chip merge processing, if cell location data and cell pattern data are intermingled in the data file, it is difficult or takes a long time to execute the reconfiguration. However, by the method of creating a cell location data file and a cell pattern data file as discrete files as described in the present Embodiment, reconfiguration of location data is able to be freely performed and reconfiguration processing of location data is able to be easily executed.

At the step S108 of FIG. 1, as an input process, the writing data processing circuit 120 inputs the writing data 12 created in the writing data creation apparatus 300. In this inputting process, cell pattern data whose data amount is especially large, compared with a cell location data file or a link file which can be structured by data of short numerical values or identifiers, is not repeatedly written as mentioned above. Thus, it is aimed to compress the data amount by storing the cell pattern data in order only once in one segment as shown in FIG. 6C. Consequently, input processing (data transmission processing) time can be greatly shortened.

Figure 9:
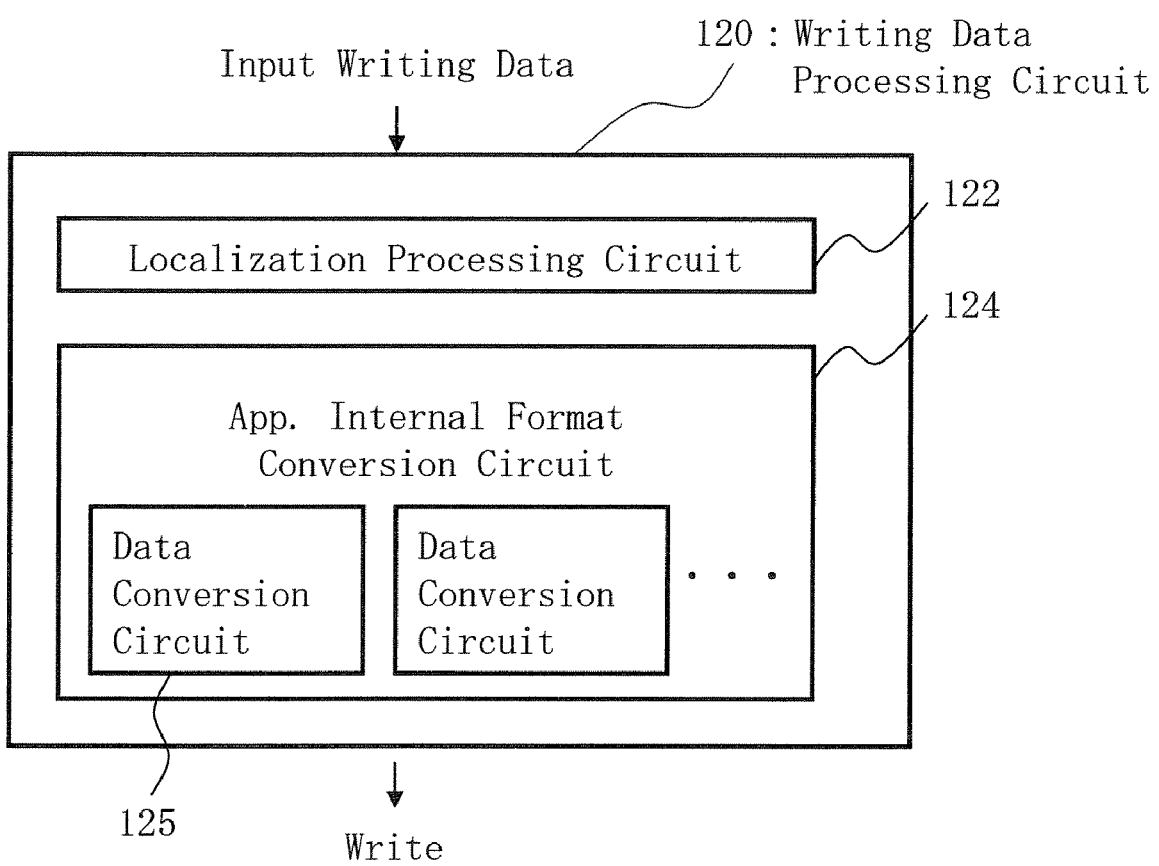
FIG. 9 is a block diagram showing a main configuration of a writing data processing circuit described in Embodiment 1.

FIG. 9 is a block diagram showing a main configuration of a writing data processing circuit described in Embodiment 1. In the figure, the writing data processing circuit 120 includes a localization processing circuit 122 and a writing apparatus internal format conversion circuit 124. A plurality of data conversion circuits 125 are located in the writing apparatus internal format conversion circuit 124. Configuration elements required for explaining Embodiment 1 are illustrated in FIG. 9, and it should be understood that other configuration elements usually needed for the writing data processing circuit 120 are also included. For example, an illustration of an input and/or output means etc. is omitted.

At the step S110 of FIG. 1, as a localization process, from a pattern data file in the inputted writing data 12, the localization processing circuit 122 re-creates the cell pattern data file in which cell pattern data composed of one or more elementary patterns is respectively stored in corresponding data structure to the each block in which the cell pattern data is located.

Figure 10A:
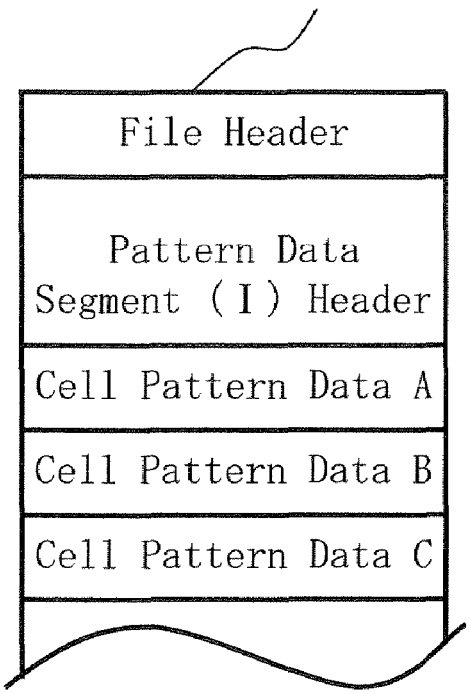
FIGS. 10A and 10B show examples of a cell pattern data file before and after localization processing described in Embodiment 1.
Figure 10B:
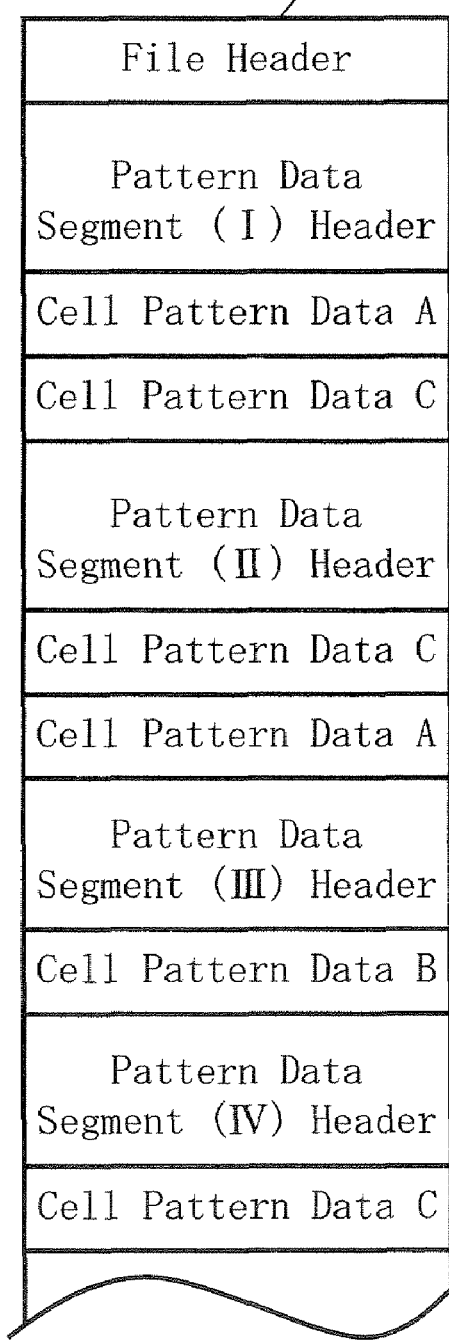

FIGS. 10A and 10B show examples of a cell pattern data file before and after localization processing. FIG. 10A illustrates the cell pattern data file shown in FIG. 6B, whose data amount is compressed by the above mentioned method of only once storing each of all the types of pattern data in order in one segment. This cell pattern data file can be re-created into the one shown in FIG. 10B in which cell pattern data of required type to be located for each block area is collected (localized) as one segment, and the cell pattern data is stored in each block area. Concretely explaining the above, in the cell pattern data file of FIG. 10A, only one segment, in which cell pattern data of all the types is respectively stored only once, is prepared for a block meaning any block. On the other hand, in the cell pattern data file of FIG. 10B, there are two or more segments each of which corresponds to each block, and cell pattern data needed in each block is defined for a corresponding segment. For example, cell pattern data A and C is needed in the block (0, 0) in FIG. 5, and defined to be in a segment (I) corresponding to the block (0, 0). This process of re-storing (re-defining) all type cell pattern data, each of which is stored only once in one segment at first, to be in two or more segments, each of which corresponds to each block, is called "localization."

In the case of FIG. 10B, following the file header of the cell pattern data file, the header of pattern data segment (I), cell pattern data A indicating pattern data of cell A, cell pattern data C indicating pattern data of cell C, the header of pattern data segment (II), cell pattern data C indicating pattern data of cell C, cell pattern data A indicating pattern data of cell A, the header of pattern data segment (III), cell pattern data B indicating pattern data of cell B, the header of pattern data segment (IV), and cell pattern data C indicating pattern data of cell C are stored in order.

FIGS. 11A, 11B and 11C are illustrated for explaining a relation between the cell location data file and the cell pattern data file after localization processing. As shown in the figures, the pattern data segment (I) corresponds to the block (0, 0), pattern data segment (II) corresponds to the block (0, 1), pattern data segment (III) corresponds to the block (1, 0), and pattern data segment (IV) corresponds to the block (1, 1) respectively.

Collecting (performing localization) cell pattern data to be located for each block area as one segment and storing the cell pattern data in each block area, results in increasing the data amount, but it becomes possible to perform parallel processing among blocks in the writing apparatus internal format conversion process (described later). It should be understood that contents of the link file are to be changed with the reconfiguration of the cell pattern data file.

At the step S112 of FIG. 1, as a writing apparatus internal format conversion process, the writing apparatus internal format conversion circuit 124 converts the writing data 12 into the writing apparatus internal format to create the writing apparatus internal data 14. As a concrete example of the conversion processing into a writing apparatus internal format, distributed processing, such as cluster segmentation processing and shot data creation, is performed. In this case, if each processing is performed in order in series, processing time will become extremely large. Regarding the structure of the writing data 12 at the time of being input into a writing apparatus, all cell pattern data is stored in one pattern data segment. In the case of performing parallel processing for this structure, each of a plurality of data conversion circuits 125 in the writing apparatus internal format conversion circuit 124 needs to input all the cell pattern data, search a necessary cell pattern in it, and read the searched one to execute processing. Therefore, the input processing will take time and the parallel processing will become inefficient. However, by performing a pre-process of storing the cell pattern data after being divided into segments each of which corresponds to a block, it becomes enough for each of the conversion circuits 125 to input only one necessary segment. Therefore, compared to the case without the pre-process, input data amount can be very small and input processing can be shortened.

In this case, if two or more cell patterns of the same type are located in one block area, it is suitable to store the cell pattern data only once. The data amount can be compressed (reduced) by not storing it a plurality of times. In the example shown in FIG. 11C, the pattern data segment (III) for the block (1, 0) corresponds to this case. Although it is required to refer to the cell pattern data B once for the cell location data L5 and L6 respectively, namely totally twice, the cell pattern data B is stored only once in the pattern data segment (III).

Thus, as mentioned above, the writing data is converted into data of the writing apparatus internal format used in the writing apparatus based on each data group of the cell location data, the cell pattern data, and the link data. Then, a intended pattern is written on a target object based on the converted data of the writing apparatus internal format.

The data structure according to the present Embodiment enables transmission time reduction at the time of transmitting data from the outside of the writing apparatus into the writing apparatus by the method of decreasing data amount as much as possible by defining cell pattern data all together in the whole chip regardless of a block, as the writing data 12 described. Conversely, inside the writing apparatus, the data structure according to the present Embodiment enables processing time reduction by defining the cell pattern data dividing it into some groups based on localization processing and by performing parallel processing among blocks at the time of writing apparatus internal format conversion.

Embodiment 2

Figure 12:
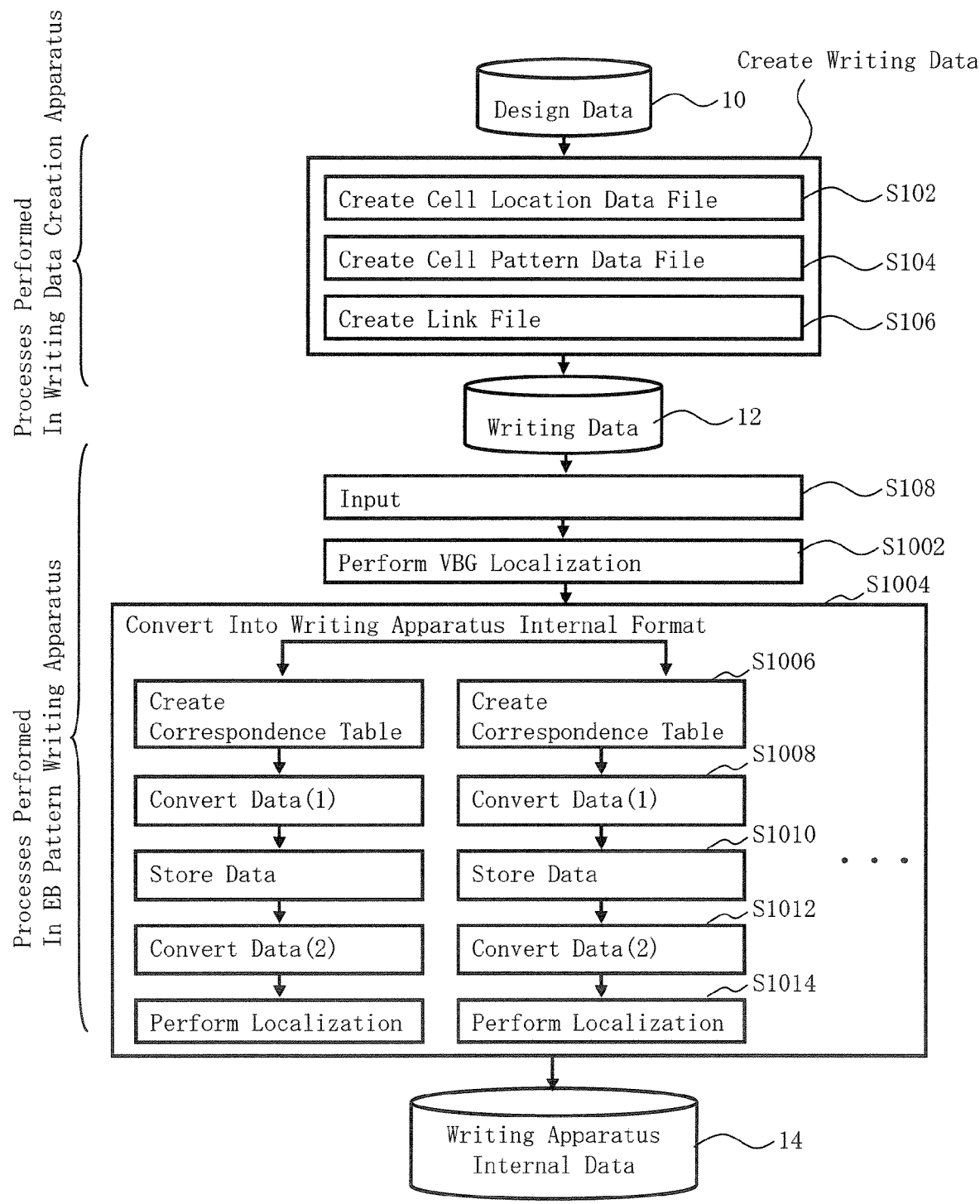
FIG. 12 is a flowchart showing main processes of a creation method of electron beam writing data and a conversion method of electron beam writing data according to Embodiment 2.

FIG. 12 is a flowchart showing main processes of a creation method of electron beam writing data and a conversion method of electron beam writing data according to Embodiment 2. As shown in the figure, the design data 10 is converted into the writing data 12 in the writing data creation apparatus 300. Then, the created writing data 12 is input into an electron beam pattern writing apparatus 100 and converted into the writing apparatus internal data 14. The contents of FIG. 12 are the same as the case in Embodiment 1 in the respect that the creation method of electron beam writing data executes a series of the processes below: a cell location data file creation process (S102) as an example of a location data file creation process, a cell pattern data file creation process (S104) as an example of a pattern data file creation process, and a link file creation process (S106).

Then, the conversion method of electron beam writing data executes a series of processes: the input process (S108), a VBG (Virtual Block Group) localization process (S1002), and a writing apparatus internal format conversion process (S1004) that includes a correspondence table creation process (S1006), a data conversion process (1) (S1008), a data storage process (S1010), a data conversion process (2) (S1012), and a localization process (S1014).

The structure of the variable-shaped EB writing apparatus 100 may be the same as that of FIG. 2. Moreover, the configuration of the writing data creation apparatus 300 may be the same as that of FIG. 3.

Figure 13:
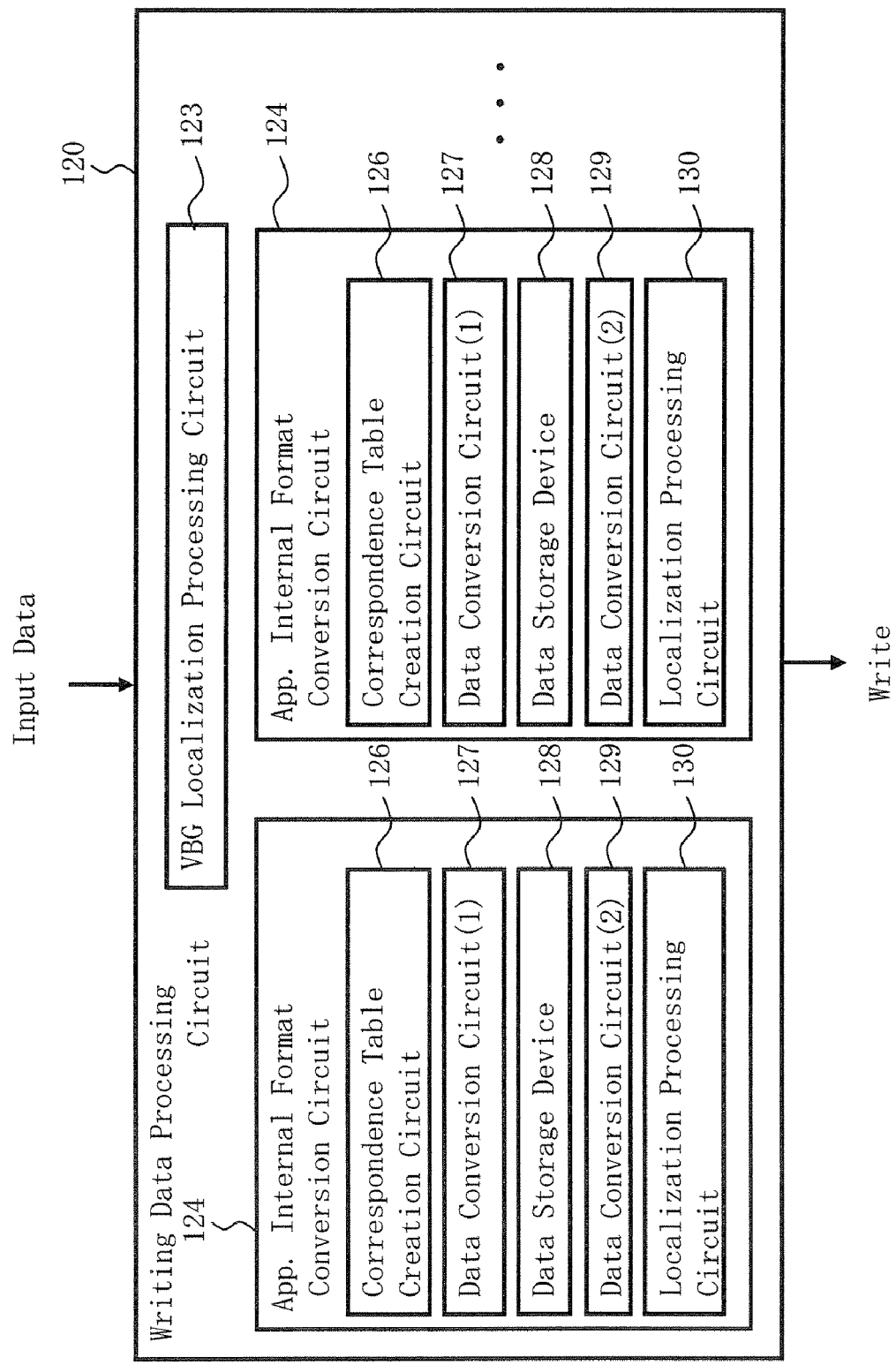
FIG. 13 is a block diagram showing a main configuration of a writing data processing circuit described in Embodiment 2.

FIG. 13 is a block diagram showing a main configuration of a writing data processing circuit according to Embodiment 2. In the figure, the writing data processing circuit 120 includes a VBG localization processing circuit 123 and a plurality of writing apparatus internal format conversion circuits 124. In the writing apparatus internal format conversion circuit 124, a correspondence table creation circuit 126, a data conversion circuit (1) 127, a data storage device 128, a data conversion circuit (2) 129, and a localization processing circuit 130 are arranged. Configuration elements required for explaining Embodiment 2 are illustrated in FIG. 13, and it should be understood that other configuration elements usually needed for the writing data processing circuit 120 are also included. For example, an illustration of an input and/or output means etc. is omitted.

Figure 14:
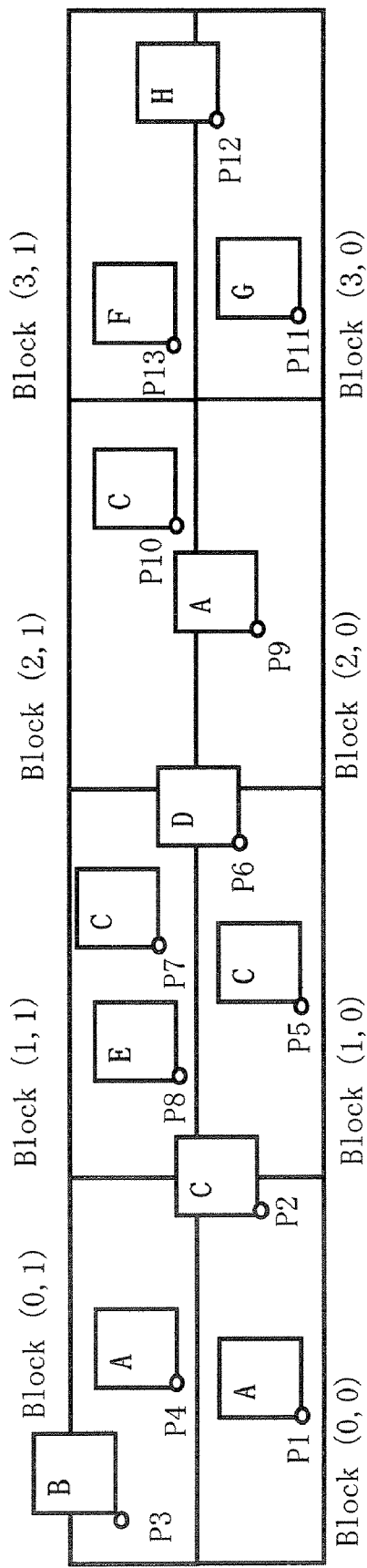
FIG. 14 shows an example of cell location.

FIG. 14 shows an example of cell location. For example, it is assumed that cells A to H as shown in FIG. 14 are located in each block in part of a certain frame. Concretely, the position of each block is plotted in coordinates. In the block (0, 0), a cell A is located at coordinate point P1 and a cell C is located at coordinate point P2. The contents of FIG. 14 are the same as the case in Embodiment 1 in the respect that a cell to be located in a block is decided upon a position of the reference point of the cell. In the block (0, 1), a cell B is located at coordinate point P3 and a cell A is located at coordinate point P4. In the block (1, 0), a cell C is located at coordinate point P5 and a cell D is located at coordinate point P6. In the block (1, 1), a cell C is located at coordinate point P7 and a cell E is located at coordinate point P8. In the block (2, 0), a cell A is located at coordinate point P9. In the block (2, 1), a cell C is located at coordinate point P10. In the block (3, 0), a cell G is located at coordinate point P11 and a cell H is located at coordinate point P12. In the block (3, 1), a cell F is located at coordinate point P13.

The content of each process of processes S102 to S108 in FIG. 12 is the same as that of Embodiment 1. However, since the cell location used for explanation in FIG. 12 as an example differs from the one used in Embodiment 1, contents of the cell location data file and the cell pattern data file differ from those in Embodiment 1. Now, an example case of the present Embodiment will be described.

Figures 15A, 15B, 15C:
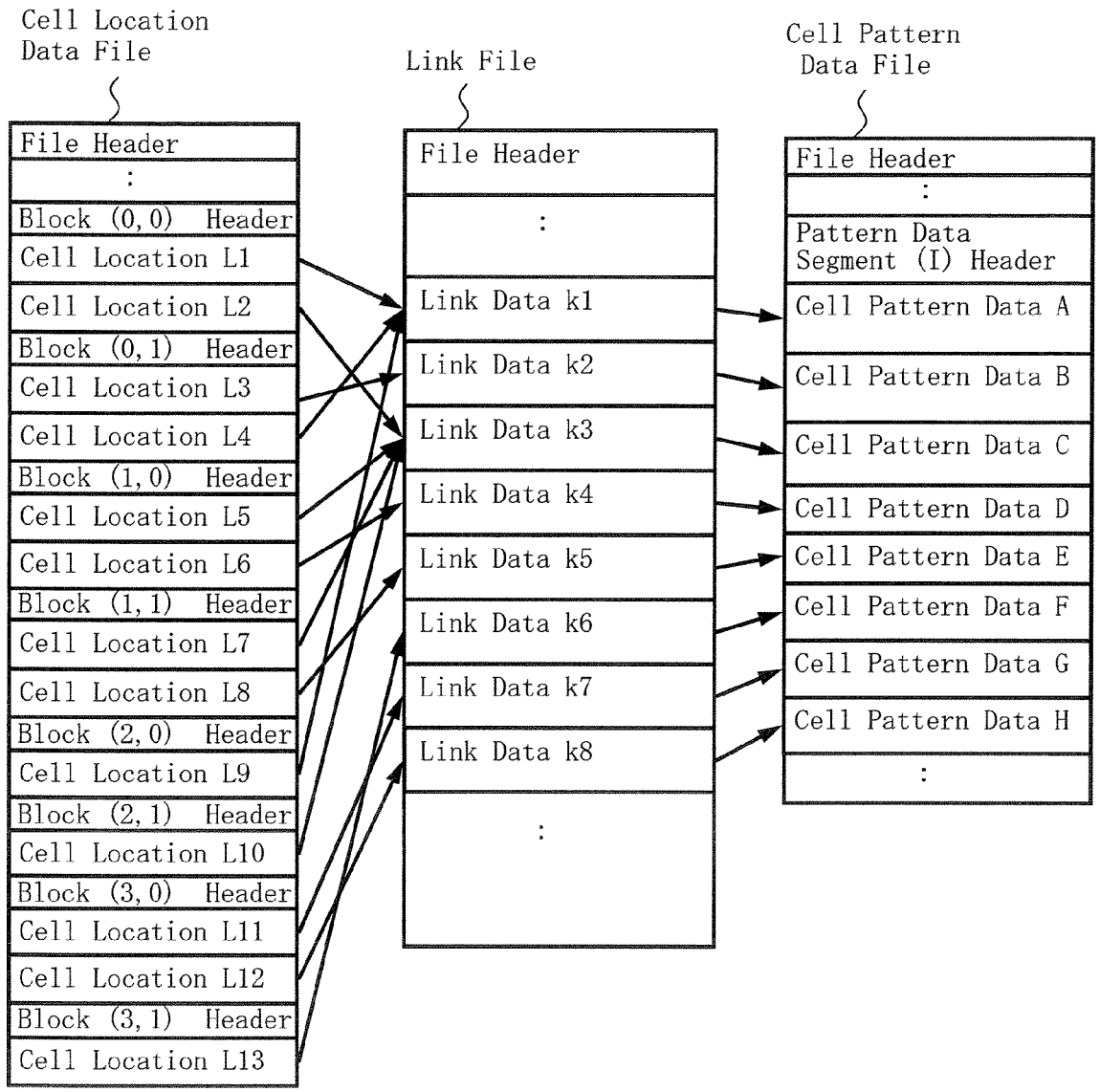
FIGS. 15A, 15B and 15C show examples of a cell location data file, a link file and a cell pattern data file described in Embodiment 2.

FIGS. 15A, 15B and 15C show examples of the cell location data file, the link file and the cell pattern data file described in Embodiment 2. The cells A to H are composed of one or more elementary patterns. As shown in FIG. 15A, in the cell location data file, location data for locating one of the cells A to H in each block area is included. The each block area is one of a plurality of block areas made by virtually dividing a writing area as stated above. The cell location data is represented by location data etc. of the reference point of the cell. In FIG. 15A, following the file header of the cell location data file, the header of the block (0, 0), cell location data L1 and cell location data L2 being information on locational positions of the cells located in the block (0, 0), the header of the block (0, 1), cell location data L3 and cell location data L4 being information on locational positions of the cells located in the block (0, 1), the header of the block (1, 0), cell location data L5 and cell location data L6 being information on locational positions of the cells located in the block (1, 0), the header of the block (1, 1), cell location data L7 and cell location data L8 being information on locational positions of the cells located in the block (1, 1), the header of the block (2, 0), cell location data L9 being information on locational position of the cell located in the block (2, 0), the header of the block (2, 1), cell location data L10 being information on locational position of the cell located in the block (2, 1), the header of the block (3, 0), cell location data L11 and cell location data L12 being information on locational positions of the cells located in the block (3, 0), the header of the block (3, 1), and cell location data L13 being information on locational position of the cell located in the block (3, 1) are stored in the cell location data file. The contents of the cell location data may be the same as those of FIG. 7.

As shown in FIG. 15C, the cell pattern data file includes pattern data of each of the cells A to H, being one or more elementary patterns mentioned above. In this case, following the file header of the cell pattern data file, the header of pattern data segment (I), cell pattern data A indicating pattern data of the cell A, cell pattern data B indicating pattern data of the cell B, cell pattern data C indicating pattern data of the cell C, cell pattern data D indicating pattern data of the cell D, cell pattern data E indicating pattern data of the cell E, cell pattern data F indicating pattern data of the cell F, cell pattern data G indicating pattern data of the cell G, and cell pattern data H indicating pattern data of the cell H are orderly stored once. The cell pattern data includes figure data, etc. being large amount for configuring a cell pattern. When cells are located in the layout as shown in FIG. 14, the cell pattern data A is needed for the cell location data L1, L4, and L9, the cell pattern data B is needed for the cell location data L3, the cell pattern data C is needed for the cell location data L2, L5, L7 and L10, the cell pattern data D is needed for the cell location data L6, the cell pattern data E is needed for the cell location data L8, the cell pattern data F is needed for the cell location data L13, the cell pattern data G is needed for the cell location data L11, and the cell pattern data H is needed for the cell location data L12.

If such cell pattern data is stored several times repeatedly for each location, the amount of the data will become huge. Then, by only once storing each type of cell pattern data in order in one segment as shown in FIG. 15C, it is possible to compress the data amount. Information is referred to from the cell location data to the cell pattern data through the link data as FIG. 6B. The contents of the link data may be the same as those of FIG. 8.

In the writing data creation apparatus 300, as mentioned above, a data amount can be compressed by creating a cell location data file, a cell pattern data file, and a link file as part of the writing data 12. Then, compressing the data amount enables access time to necessary data to be reduced. Consequently, it is possible to create the writing data 12 whose necessary data can be read effectively.

Although cell data has been focused on as an internal configuration element in the above, it is not restricted to the cell data. It is also acceptable to have a data structure focusing on other hierarchical data, which is the same as the description in Embodiment 1.

Moreover, in accordance with the present Embodiment, reconfiguration of location data can be freely performed and reconfiguration processing of the location data can be easily executed by the method of creating a cell location data file and a cell pattern data file as discrete files, which is the same as the description in Embodiment 1.

Moreover, as shown in FIG. 15C, it is possible to compress data amount by storing cell pattern data in order only once in one segment, and consequently to greatly shorten input processing (data transmission processing) time, which is also the same as the description in Embodiment 1.

Figure 16A:
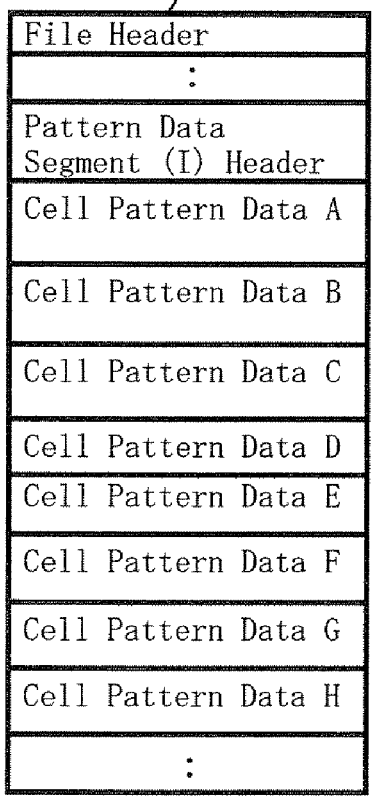
FIGS. 16A and 16B show examples of a cell pattern data file before and after localization processing described in Embodiment 2.
Figure 16B:
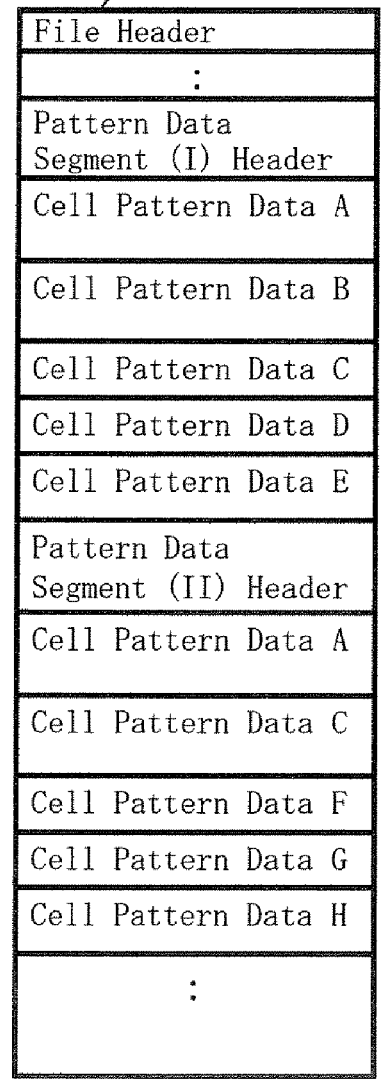

In Embodiment 2, localization processing is performed based on a unit of a plurality of blocks of VBG (Virtual Block Group) at the step S1002 of FIG. 12, not by a unit of a block used in Embodiment 1. FIGS. 16A and 16B show examples of the cell pattern data file before and after the VBG localization processing. FIG. 16A depicts the cell pattern data file shown in FIG. 15C, in which cell pattern data is stored only once in one segment as mentioned above. Localization processing is performed for this cell pattern data based on a VBG unit. In the present case as to FIG. 14, the block (0, 0), the block (0, 1), the block (1, 0), and the block (1, 1) are grouped as one VBG, and the block (2, 0), the block (2, 1), the block (3, 0), and the block (3, 1) are grouped as another VBG. Cell pattern data is localized per cell pattern data segment corresponding to each VBG. The cell pattern data file after the localization processing for each VBG is shown in FIG. 16B.

At the step S1004 in FIG. 12, converting into the writing apparatus internal data is performed for each VBG in parallel in the writing apparatus internal format conversion circuit 124. Similarly to Embodiment 1 in which localization is performed per block in order to make parallel processing more efficient, localization processing of the present Embodiment is performed per VBG being a processing unit of parallel processing, so that the efficiency of the parallel processing is promoted. In the writing apparatus internal format conversion circuit 124, as a correspondence table creation process at the step S1006, the correspondence table creation circuit 126 examines the content of a cell pattern data segment corresponding to one VBG in order to find and divide the cell pattern data into two groups: cell pattern data referred to a plurality of times by different blocks and cell pattern data referred to by only one block. Now, a cell in the cell pattern data referred to a plurality of times by different blocks is defined as a "reference cell", and a cell in the cell pattern data referred to by only one block is defined as a "value cell." Then, a correspondence table is created where each of cell pattern data of cells, each of which is a "reference cell" or a "value cell", corresponds to its reference times.

The segment (I) corresponding to the first VBG, in FIG. 16B will now be explained. FIG. 17 shows an example of the correspondence table, in which it is illustrated in a corresponding manner that the cell pattern data A is pattern data of a "reference cell" referred to twice, the cell pattern data B is pattern data of a "value cell" referred to once, the cell pattern data C is pattern data of a "reference cell" referred to three times, the cell pattern data D is pattern data of a "value cell" referred to once, and the cell pattern data E is pattern data of a "value cell" referred to once.

At the step S1008 in FIG. 12, as a data conversion process (1), a "reference cell" is converted into a writing apparatus internal format using the data conversion circuit 127. For example, conversion processing, such as cluster segmentation processing and shot data creation, is performed. It is possible to discern pattern data of one or more elementary pattern to be converted, or in other words, to discern cell pattern data of a "reference cell", based on the correspondence table.

At the step S1010, as a data storage process, the data conversion circuit 127 stores and saves data in which cell pattern data of "reference cells" has already been converted, in the data storage device 128.

At the step S1012, as a data conversion process (2), the data conversion circuit 129 similarly performs converting the cell pattern data of a "value cell" into the writing apparatus internal format.

Figure 18:
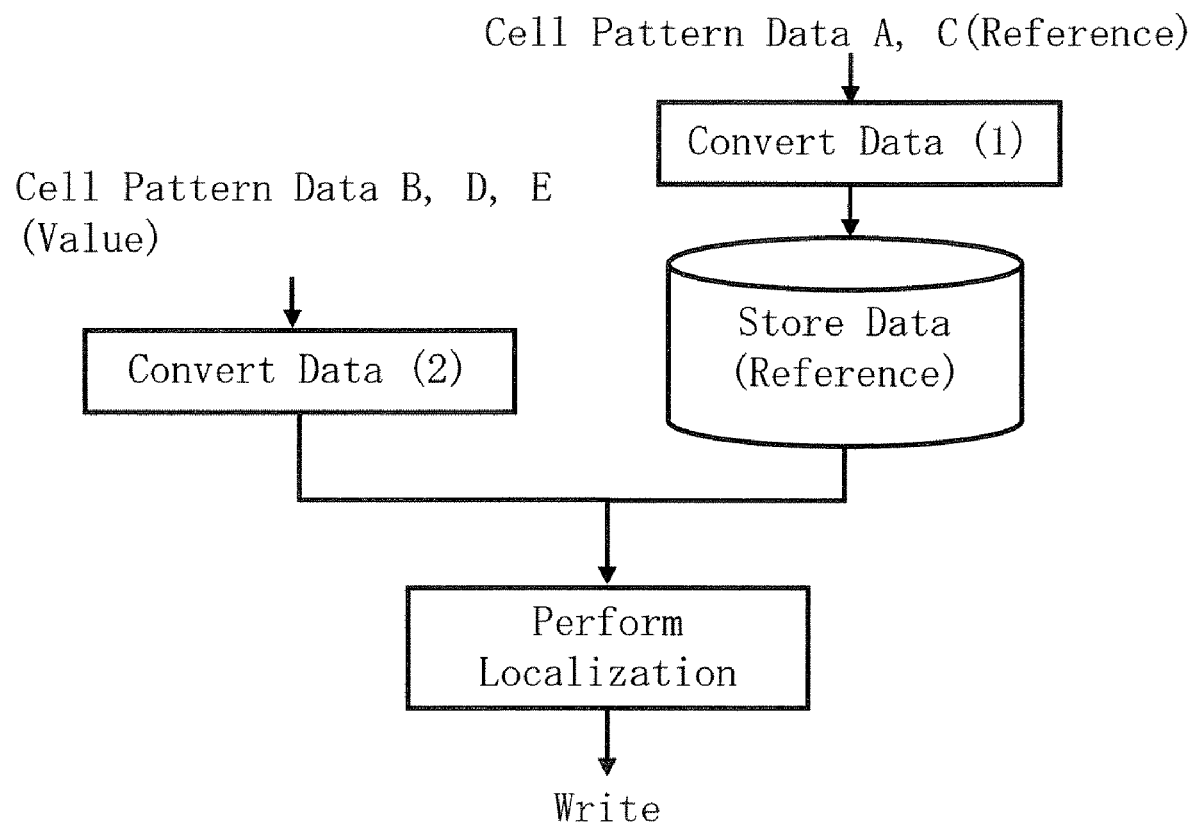
FIG. 18 shows a writing data conversion flow in a writing apparatus described in Embodiment 2.

FIG. 18 shows a writing data conversion flow in the writing apparatus according to Embodiment 2. First, as a data conversion (1), the cell pattern data A and C, being cell pattern data of "reference cells", is converted into the writing apparatus internal format. Then, the converted cell pattern data A and C is stored in the storage device. Next, as a data conversion (2), conversion is performed for the cell pattern data B, D, and E, being cell pattern data of "value cells." At the localization S1014 that is the last process, the cell pattern data after the conversion is localized at each block to be output. Regarding the stored cell pattern data A and C, being cell pattern data of "reference cells", in the storage device is used without conversion. By the method mentioned above, the writing data 12 is converted into the writing apparatus internal data 14. Thus, the method of converting pattern data of the cell pattern to be used a plurality of times in the writing area, into data of the writing apparatus internal format, storing the converted data in the storage device, and reading the stored data from the storage device instead of converting it at the data conversion process (2), enables conversion processing time to be reduced.

In other words, data of the reference cells A and C is converted into the writing apparatus internal format at the data conversion (1) and stored in the storage device. Since the writing apparatus internal format data of the reference cells is stored in the storage device, it is unnecessary to convert the cell pattern data of the reference cells at the data conversion (2). Only reading the stored data from the storage device is needed. That is, processing time required at the data conversion (2) is just the time for converting the value cell pattern data into the writing apparatus internal format. Therefore, the processing time can be shorter compared with the case of converting cell pattern data of the cells A to E at the conversion (2).

As mentioned above, compared with the case where all the completely flat data is processed one by one, data processing time inside the apparatus can be shortened by performing processes of the writing data 12 with keeping its hierarchical structure in the area of some extent. Furthermore, by performing parallel processing, data processing time inside the apparatus can be largely reduced. Consequently, it is possible to realize a data processing system of high throughput for a writing apparatus.

What is expressed by "circuit" or "process" in the above description can be configured by a computer-executable program. It may be executed by a software program, or alternatively by any combination of software, hardware and/or firmware. When configured by a program, the program is recordable or storable onto a recording medium, such as a magnetic disk drive, magnetic tape drive, FD or ROM (read-only memory).

Figure 19:
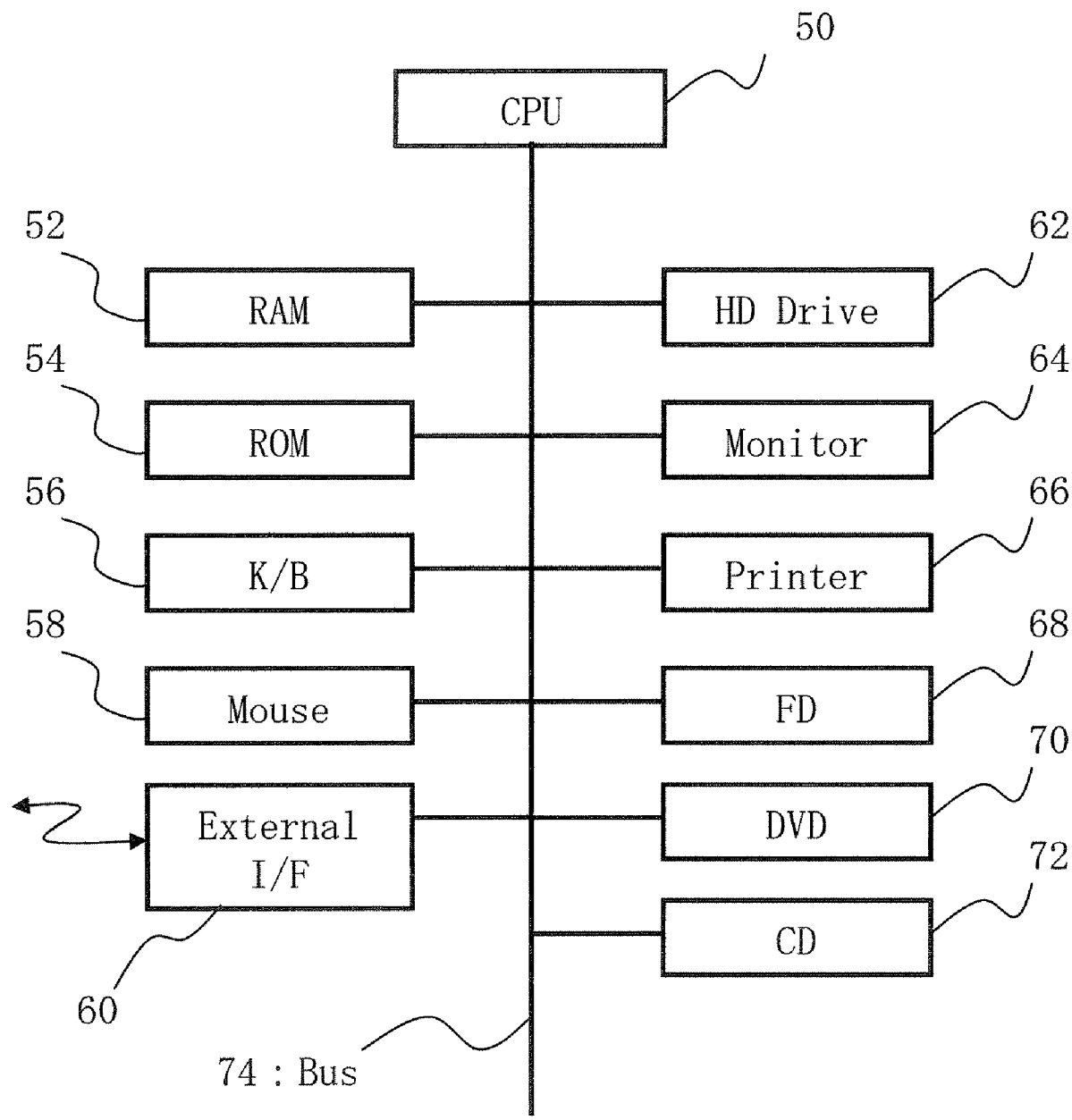
FIG. 19 is a block diagram showing a hardware configuration example in the case of configuring by a program.
Figure 20:
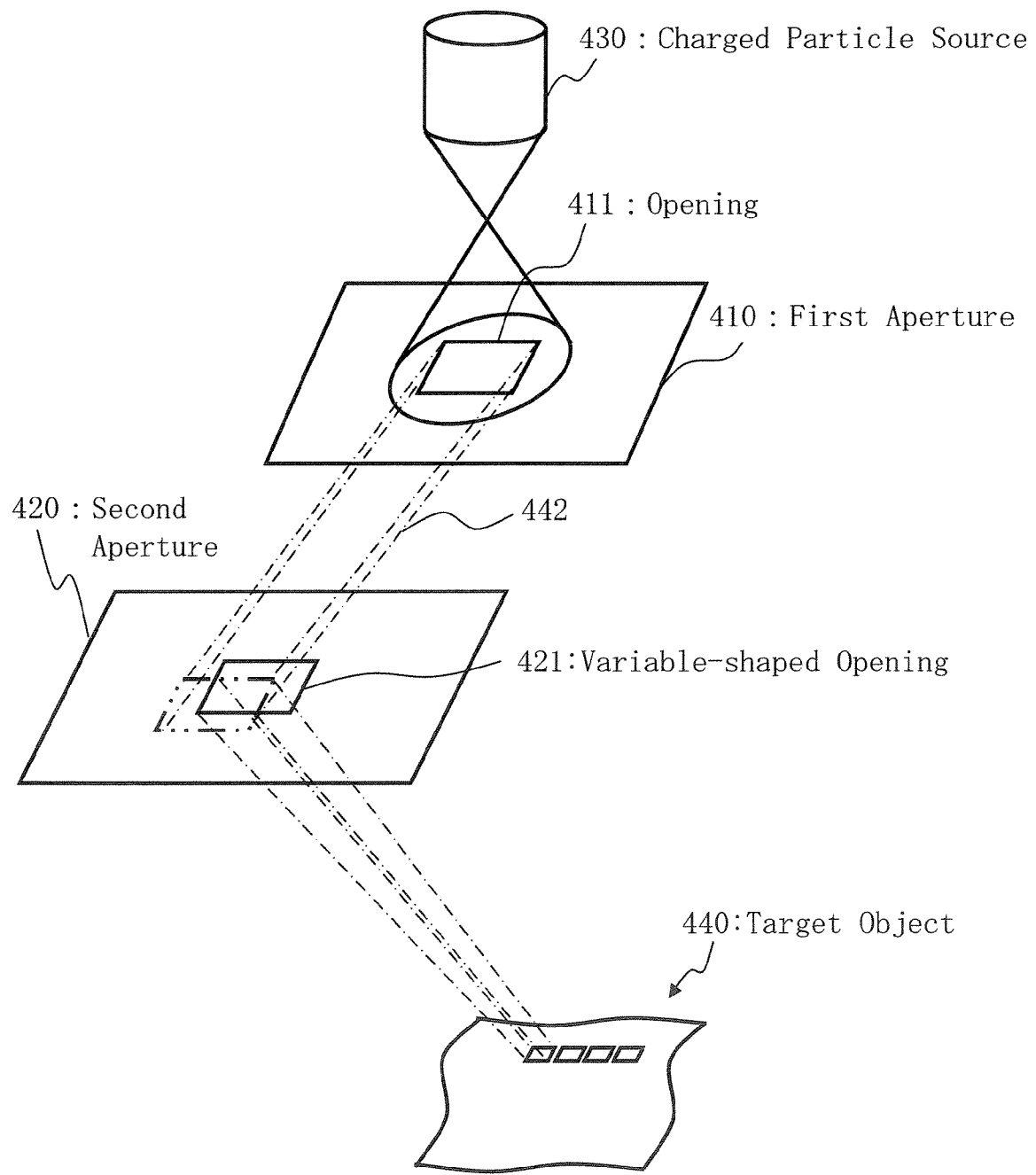
FIG. 20 shows a conceptual diagram for explaining operations of a variable-shaped electron beam pattern writing apparatus.

FIG. 19 is a block diagram showing a hardware configuration example in the case of configuring by a program. A CPU 50 being a computer is connected to a RAM (random access memory) 52, a ROM 54, a magnetic-disk (HD) drive 62, a keyboard (K/B) 56, a mouse 58, an external interface (I/F) 60, a monitor 64, a printer 66, FD 68, DVD 70 and CD 72 through a bus 74. The RAM 52, ROM 54, magnetic-disk (HD) drive 62, FD 68, DVD 70 and CD 72 are examples of a storage device. The keyboard (K/B) 56, mouse 58, external interface (I/F) 60, FD 68, DVD 70 and CD 72 are examples of an input means. The external interface (I/F) 60, monitor 64, printer 66, FD 68, DVD 70 and CD 72 are examples of an output means.

Referring to concrete examples, Embodiments have been described in the above. However, the present invention is not limited to these examples. For example, although the cell data has been focused on as an internal configuration element in each of the above Embodiments, it is not restricted to the cell data. It is also acceptable to have a data structure focusing on other hierarchical data. Moreover, although linking location data and pattern data is performed based on link data in a link file in each Embodiment, it is not restricted to this method. Any means by which pattern data to be arranged for location data can be obtained is acceptable. For example, it is allowable to store an identifier (e.g. address of pattern data) for accessing desired pattern data, in location data.

Although description of apparatus components, control methods, etc. not directly required in explaining the present invention is omitted, it is possible to suitably select and use some or all of them when necessary. For example, while configuration of a control unit for controlling the variable-shaped EB writing apparatus 100 is not described in detail, it should be understood that needed control unit configuration can be suitably selected and used.

Any other creation methods of electron beam writing data, conversion methods of electron beam writing data, and apparatuses thereof which include elements of the present invention and which are design-modifiable by those skilled in the art are incorporated within the range of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A creation method of charged particle beam writing data for writing a pattern using a charged particle beam based on design data of circuits, comprising:

creating, based on the design data, a location data file including location data, as part of the writing data, the location data being defined for locating one of a plurality of pattern data including one or more elementary patterns in each block area of a plurality of block areas, the plurality of block areas being made by virtually dividing a writing area;

creating, based on the design data, a pattern data file including pattern data including the one or more elementary patterns, as part of the writing data; and creating, based on the design data, a link file including link data for linking each of the location data and each of the pattern data, as part of the writing data, wherein the location data file, the pattern data file, and the link file are different from each other and are output as the writing data, and the pattern data is referred to from the location data through the link data.

2. The creation method according to claim 1, wherein each block area is in a frame area which is one of strip-like regions into which a chip, which is a component part of an intended pattern to write onto a target object, is virtually divided in a parallel direction to the target object surface.

3. The creation method according to claim 2, wherein each block area is formed by dividing the frame area into areas of a predetermined size.

4. The creation method according to claim 1, wherein the pattern data includes cell pattern data.

5. The creation method according to claim 1, wherein the location data includes a location coordinate for the pattern data and an index of the link data to the pattern data.

6. The creation method according to claim 1, wherein the location data file, the pattern data file, and the link file are created for each frame area which is one of strip-like regions into which a chip is virtually divided in a parallel direction to a target object surface.

7. The creation method according to claim 1, wherein the location data file and the link file are created for each of a frame area and the pattern data file is created for each of a frame area or a chip.

8. The creation method according to claim 1, wherein when creating the pattern data file, each of the pattern data, including one or more elementary patterns to be included in the pattern data file, is stored once.

9. The creation method according to claim 1, wherein when creating the pattern data file, each of the pattern data, including one or more elementary patterns, is stored once in the pattern data file, the method further comprising:

re-creating the pattern data file to respectively store the pattern data including one or more elementary patterns in a pattern data segment corresponding to each block area where the pattern data is located in a writing apparatus.

10. The creation method according to claim 9, wherein when re-creating the pattern data file, when a pattern data including one or more elementary patterns is located a plurality of times at different positions in a block area, the pattern data is stored once in the pattern data segment corresponding to the block area.

11. The creation method according to claim 1, wherein the charged particle beam includes an electron beam.

12. A creation method of writing data for writing a pattern using a charged particle beam based on design data of circuits, comprising:

creating, based on the design data, a first data group collecting location data for locating one of a plurality of pattern data including one or more elementary patterns in each of a plurality of block areas, as part of the writing data, the plurality of block areas being made by virtually dividing a writing area;

creating, based on the design data, a second data group collecting each of pattern data of the plurality of pattern data including the one or more elementary patterns, as part of the writing data;

creating, based on the design data, a third data group collecting link data for linking the location data and the pattern data, as part of the writing data; and creating a data file in which the first data group, the second data group, and the third data group are combined, wherein the pattern data is referred to from the location data through the link data.

* * * * *